US008350379B2

(12) United States Patent
Low et al.

(10) Patent No.: US 8,350,379 B2
(45) Date of Patent: Jan. 8, 2013

(54) PACKAGE WITH POWER AND GROUND THROUGH VIA

(75) Inventors: Qwai H. Low, Cupertino, CA (US); Chengyu Guo, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 666 days.

(21) Appl. No.: 12/206,786

(22) Filed: Sep. 9, 2008

(65) Prior Publication Data

US 2010/0059865 A1 Mar. 11, 2010

(51) Int. Cl.
*H01L 23/04* (2006.01)

(52) U.S. Cl. ......... 257/698; 257/E23.174; 257/E23.079; 438/667

(58) Field of Classification Search .................. 257/784, 257/776, 621, 691, 692, 698, 730, E23.174, 257/E23.079; 438/667
See application file for complete search history.

(56) References Cited

U.S. PATENT DOCUMENTS

| 5,499,445 | A | | 3/1996 | Boyle et al. | |
| 5,545,923 | A | * | 8/1996 | Barber | 257/691 |
| 5,917,242 | A | * | 6/1999 | Ball | 257/737 |
| 5,977,850 | A | * | 11/1999 | Chaturvedi | 333/238 |
| 6,737,755 | B1 | * | 5/2004 | McLellan et al. | 257/796 |
| 7,615,487 | B2 | * | 11/2009 | Chang | 438/667 |
| 2009/0278244 | A1 | * | 11/2009 | Dunne et al. | 257/676 |

* cited by examiner

*Primary Examiner* — David Vu
(74) *Attorney, Agent, or Firm* — Luedeka Neely Group, P.C.

(57) ABSTRACT

A wire bond design integrated circuit with a substrate having a front side and an opposing back side. Circuitry is disposed on the font side. Electrically conductive vias are disposed through the substrate from the front side to the back side, and are electrically connected to the circuitry such that the electrically conductive vias provide power and ground services only for the circuitry. Bonding pads are disposed on the front side, and are electrically connected to the circuitry such that the bonding pads provide signal communication only for the circuitry.

10 Claims, 2 Drawing Sheets

PACKAGE WITH POWER AND GROUND THROUGH VIA

FIELD

This invention relates to the field of integrated circuits. More particularly, this invention relates to packaging for integrated circuits.

BACKGROUND

In a wire bond integrated circuit 14, the bonding pads 22 are located at the peripheral edges of the chip 14, as depicted in FIG. 1. The bonding pads 22 typically include pads for power connections (power), ground connections (ground), and signal connections. The integrated circuit 14 is typically mounted to a package substrate 12, and wire bond connections are formed between the integrated circuit 14 and the package substrate 12. Thus, the package substrate 12 also has bonding structures 24, to which wire bonds are made. The bonding wires from the power and ground connections on the integrated circuit 14 are typically made to power rings 16 and ground rings 18 that circumnavigate the portion of the package substrate 12 in which the integrated circuit 14 is mounted, called the die attach pad 20.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

The power and ground pads 22 on the integrated circuit 14 take up a significant amount of space. In some designs that have a signal:power:ground pad ratio of 4:1:1, the power and ground pads 22 take up of a third of the bonding pads 22 on the integrated circuit 14, and thus significantly increase the size of the chip 14.

As integrated circuit technology develops, an increasing number of transistors and other devices are incorporated into increasingly smaller spaces. The increased number of devices in a given integrated circuit indicates that an increased number of bonding pads 22 are required, and thus a larger chip size is needed to accommodate the additional bonding pads 22, even when the devices themselves could be accommodated by a smaller chip size. This works against the general market pressures to continually decrease the chip size of integrated circuits 14.

The power rings 16 and ground rings 18 on the package substrate 12 and the power and ground pads 22 on the integrated circuit 14 make it very difficult to reduce the size of either the chip 14 or the package substrate 12 without venturing into many added processes in integrated circuit fabrication and package assembly, which would lead to much higher costs.

One method of reducing the space needed for the bonding pads 22 and bonding fingers 24 is to reduce the pitch between the pads 22 and reduce the pitch between the fingers 24. However, these pitches can only be reduced by so much before mechanical considerations of the bonding process and bonding wires are impacted. Another method is to switch from wire bonding packages 10 to flip-chip packages. However, flip-chip packaging is generally more expensive the wire bonding packaging.

What is needed, therefore, is a system that overcomes problems such as those described above, at least in part.

SUMMARY

The above and other needs are met by a wire bond design integrated circuit with a substrate having a front side and an opposing back side. Circuitry is disposed on the font side. Electrically conductive vias are disposed through the substrate from the front side to the back side, and are electrically connected to the circuitry such that the electrically conductive vias provide power and ground services only for the circuitry. Bonding pads are disposed on the front side, and are electrically connected to the circuitry such that the bonding pads provide signal communication only for the circuitry.

In this manner, all of the bonding pads that are devoted to power and ground connections in old integrated circuit designs are eliminated, and replaced by the electrically conductive vias, which require much less space in the integrated circuit. Because the electrically conductive vias make electrical connections to the back side of the substrate, as little as no surface area on the front side of the substrate is used for power and ground connections. Thus, the integrated circuit can be made either much smaller, or to accommodate a greater number of signal bonding pads.

In various embodiments according to this aspect of the invention, the electrically conductive vias are disposed only in at least one of a centered position of the substrate and a corner position of the substrate. In some embodiments the electrically conductive vias each comprise a single vertical bore from the front side to the back side. In some embodiments at least one of the electrically conductive vias is disposed in a corner position of the substrate, such that when the substrate was singulated, only one-quarter of an original size of the at least one electrically conductive via remained in the substrate.

According to another aspect of the invention there is described a wire bond design package substrate having a front side and a back side, with a die attach pad disposed on the front side of the substrate, where the die attach pad is substantially covered with electrically conductive surfaces. The electrically conductive surfaces include at least one power surface and at least one ground surface. Electrically conductive bonding fingers are disposed outside of the die attach pad on the front side, and electrical connections are disposed on the back side. Electrically conductive traces are disposed between the front side and the back side, an electrically connect the bonding fingers and the electrically conductive surfaces on the front side to the electrical connections on the back side.

In various embodiments according to this aspect of the invention, the at least one power surface comprises four power surfaces, one of each of the four power surfaces disposed in one of each of four corner positions of the die attach pad. In some embodiments the at least one ground surface comprises only one ground surface disposed in at least a centered portion of the die attach pad. In some embodiments the die attach pad is no larger than integrated circuits that the package substrate is designed to accommodate.

According to yet another aspect of the invention there is described a packaged integrated circuit having a wire bond design integrated circuit as described above, a wire bond design package substrate as described above, where the electrically conductive surfaces of the wire bond design package substrate make electrical connections with the electrically conductive vias of the wire bond design integrated circuit, and electrically conductive bonding wires forming electrical connections between the bonding pads and the bonding fingers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
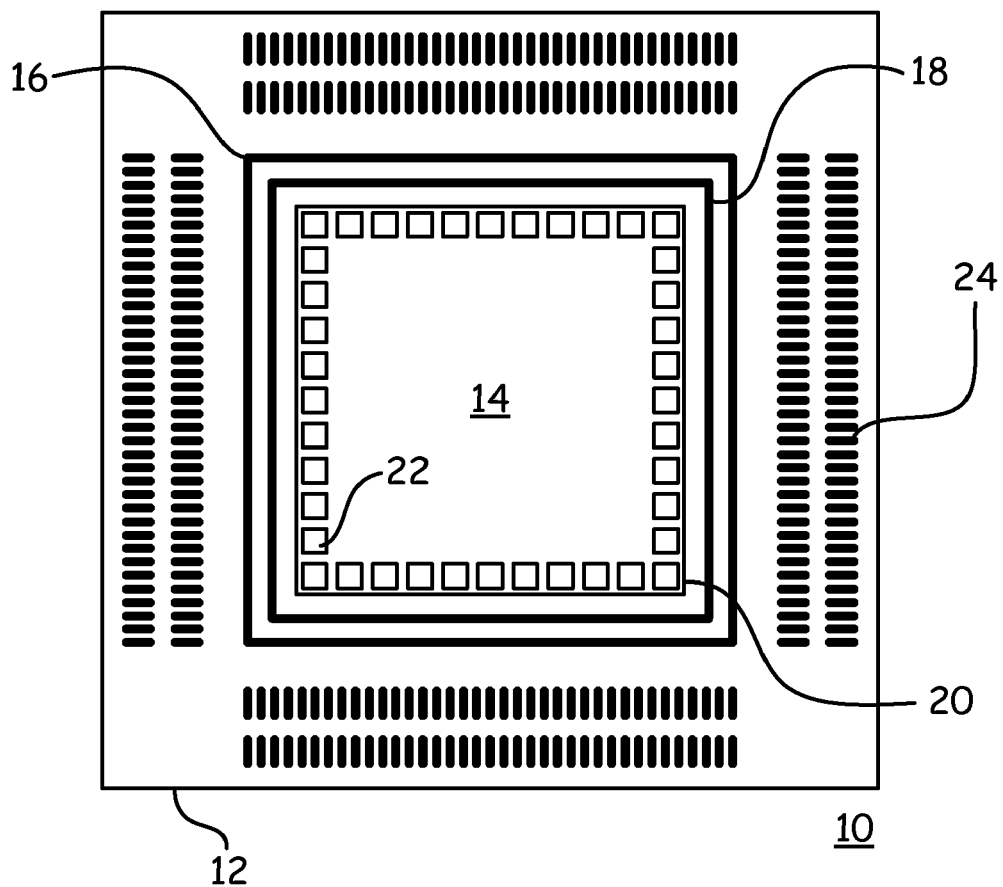
FIG. 1 is a prior art package substrate design, depicting a die attach pad, power and ground rings, and bonding fingers.
Figure 2:
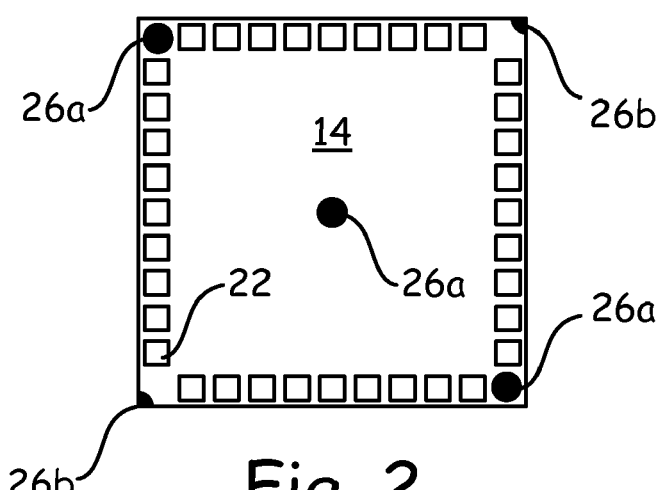
FIG. 2 is an integrated circuit according to an embodiment of the present invention, depicting three positions for an electrically conductive via, and the bonding pads for the signal connections.

With reference now to FIG. 2, and in accordance with the embodiments of the present invention, the integrated circuit 14 is fabricated with through-silicon-vias (TSV) 26 disposed in one or more locations of the chip 14, such at the center of the integrated circuit or in the corner of the integrated circuit 14. The corner position of the TSV 26a can either be entirely within the peripheral edge of the chip 14, or disposed such that the TSV 26b is cut in quarters when the integrated circuits 14 are singulated, in a manner such that a single TSV 26b can be shared by the circuitry of four integrated circuits 14 (the four that share the common corner location), which become four separate integrated circuits 14 when they are singulated.

The TSVs 26 provide a conductive pathway from the circuitry that is disposed on an upper surface of the integrated circuit 14 to the backside of the substrate on which integrated circuit 14 is formed. According to the present invention, only power and ground connections are routed out through the TSVs 26, so that no power or ground bonding pads 22 are required on the chip 14. Thus, all of the space that had been used for the power and ground bonding pads 22 is now released to other uses, such as either making the chip 14 smaller, increasing the number of bonding pads 22 for signal connections, increasing the number of devices in the integrated circuit 14, or combinations of all of the above.

Figure 3:
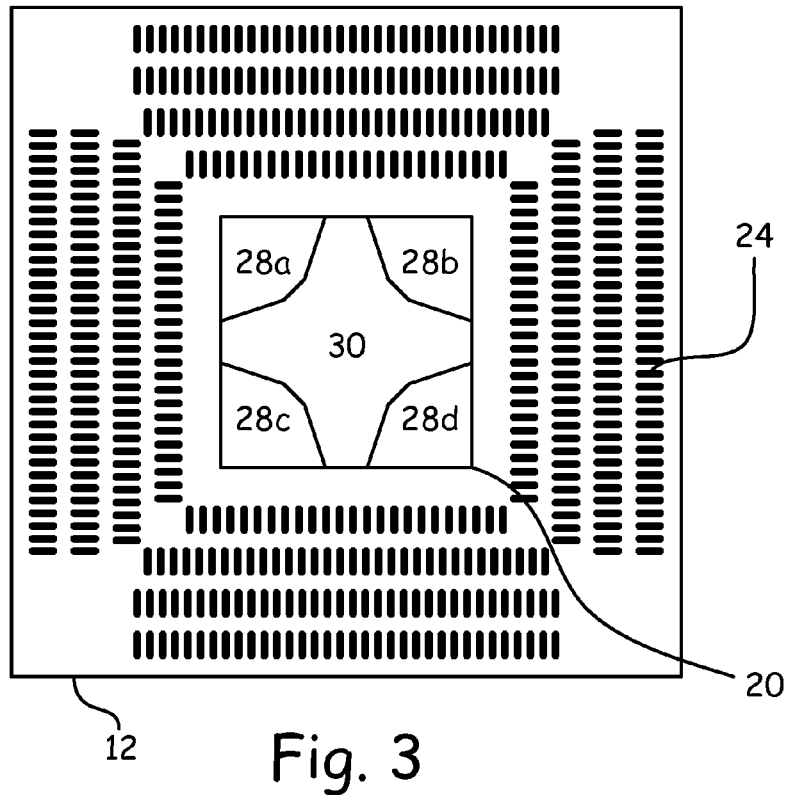
FIG. 3 is a package substrate having no power or ground rings according to an embodiment of the present invention, depicting a smaller die attach pad and a greater number of bonding fingers.

As depicted in FIG. 3, the package substrate 12 is modified so that there are electrically conductive surfaces 28 and 30 that are disposed under the TSVs 26 in the die attach pad 20 of the package substrate 12. In some embodiments the electrically conductive surfaces 28 and 30 could be aligned with and not substantially larger than the TSVs 26, which make electrical contact with them when the chip 14 is mounted to the package substrate 12. However, in other embodiments, virtually the entire surface of the die attach pad 20 of the package substrate 12 is converted into a pattern of electrically conductive surfaces 28 and 30, which makes the alignment of the chip 14 onto the package substrate 12 much less critical.

The electrically conductive surfaces 28 and 30 are preferably electrically isolated, one from another, so as to not cross power and ground supplies, or power of different voltages, etc., as desired. By using larger portions of the die attach pad 20 in this manner, a single package substrate design 12 can accommodate different sizes of integrated circuits 14, or integrated circuit designs 14 otherwise having different TSV 26 placements. The electrically conductive surfaces 28 and 30, as well as the bonding fingers 24, are routed through to electrical connections on the other side of the package substrate 12.

Similar to that as described above in regard to the chip 12, the bonding rings for the power 16 and ground 18 can be eliminated from the package substrate 12, providing an increase in the amount of available space on the surface of the package substrate 12. With the power rings 16 and ground rings 18 eliminated, the bonding fingers 24 for the signal connections can be brought in toward the die attach pad 20, creating additional space at the peripheral edges of the package substrate 12. This additional space can be used to make the package substrate 12 smaller, increase the number of bonding fingers 24 available for signal routing (such as by adding additional rings of bonding fingers 24), or a combination of the two.

Because the integrated circuit 14 can also be made smaller, thereby reducing the size of the die attach pad 20, the overall size of the smaller integrated circuit 14 mounted on the smaller package substrate 12 can be dramatically reduced. In addition, moving the bonding fingers 24 closer to the integrated circuit 14 reduces the amount of wire that is needed for the wire bond, thereby increasing the electrical performance of the connection and reducing the cost for the wire that is required by a given packaged integrated circuit 10. Shorter power and ground connections also enhance heat dissipation and handling of the greater powers that are generated by advanced integrated circuit technologies.

Figure 4:
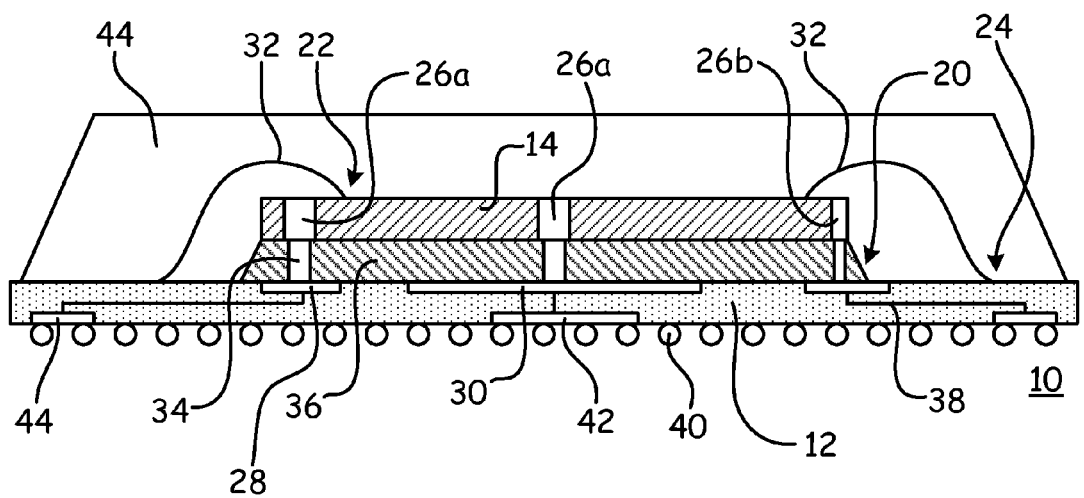
FIG. 4 is a cross sectional view of a packaged integrated circuit according to an embodiment of the present invention, depicting an integrated circuit having signal connections to a package substrate through wire bond connections and power and ground connections to the package substrate through electrically conductive vias on the back side of the integrated circuit.

With reference now to FIG. 4, there is depicted a cross sectional view of a packaged integrated circuit 10 according to an embodiment of the present invention, with an integrated circuit 14 having signal connections to the package substrate 12 through wire bond connections 32, and power and ground connections to the package substrate 12 through electrically conductive vias 26 on the back side of the integrated circuit 14. The power and ground connections can be formed such as by an anisotropic electrically conductive epoxy 34 that is disposed between the TSVs 26 and the electrically conductive surfaces 28 and 30. Also depicted in FIG. 4 are representations of the electrically conductive traces 38 that are disposed between the front side and the back side of the package substrate 12. Package connections 40 such as ball bonds (depicted) and pins (not depicted) are provided in various embodiments of the invention.

The integrated circuit 14 can be attached to the die attach pad 20 of the package substrate 12 such as by an epoxy underfill material 36. An encapsulant 44, such as an epoxy, is used to seal the integrated circuit 14 to the package substrate 12, and protect the integrated circuit 14 and the bonding wires 32. In one embodiment, power connections are run out to the edge or corners of the package substrate 12 as given at 44, and the ground connections are run out to the center of the package substrate 12, as given at 42.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A wire bond design integrated circuit, comprising:
a substrate having a front side and an opposing back side,
circuitry disposed on the front side,
electrically conductive vias disposed through the substrate from the front side to the back side, the electrically conductive vias electrically connected to the circuitry such that the electrically conductive vias provide power and ground services only for the circuitry, wherein the electrically conductive vias are disposed only in at least one of a centered position of the substrate and a corner position of the substrate, and
bonding pads disposed on the front side, the bonding pads electrically connected to the circuitry such that the bonding pads provide signal communication only for the circuitry.

2. The wire bond design integrated circuit of claim 1, wherein at least one of the electrically conductive vias is disposed in a corner position of the substrate, such that when the substrate was singulated, only one-quarter of an original size of the at least one electrically conductive via remained in the substrate.

3. A wire bond design package substrate, comprising:
a substrate having a front side and a back side,
a die attach pad disposed on the front side of the substrate, the die attach pad substantially covered with electrically conductive surfaces, the electrically conductive surfaces including at least one power surface and at least one ground surface, wherein the die attach pad is no larger than integrated circuits that the package substrate is designed to accommodate,
electrically conductive bonding fingers disposed outside of the die attach pad on the front side,
electrical connections disposed on the back side, and
electrically conductive traces disposed between the front side and the back side, the electrically conductive traces electrically connecting the bonding fingers and the electrically conductive surfaces on the front side to the electrical connections on the back side.

4. The wire bond design package substrate of claim 3, wherein the at least one power surface comprises four power surfaces, one of each of the four power surfaces disposed in one of each of four corner positions of the die attach pad.

5. The wire bond design package substrate of claim 3, wherein the at least one ground surface comprises only one ground surface disposed in at least a centered portion of the die attach pad.

6. A packaged integrated circuit, comprising:
a wire bond design integrated circuit, comprising:
an integrated circuit substrate having a front side and an opposing back side,
circuitry disposed on the font side of the integrated circuit substrate,
electrically conductive vias disposed through the integrated circuit substrate from the front side of the integrated circuit substrate to the back side of the integrated circuit substrate, the electrically conductive vias electrically connected to the circuitry such that the electrically conductive vias provide power and ground services only for the circuitry, wherein the electrically conductive vias are disposed only in at least one of a centered position of the integrated circuit substrate and a corner position of the integrated circuit substrate, and
bonding pads disposed on the front side of the integrated circuit substrate, the bonding pads electrically connected to the circuitry such that the bonding pads provide signal communication only for the circuitry,
a wire bond design package substrate, comprising:
a package substrate having a front side and a back side,
a die attach pad disposed on the front side of the package substrate, the die attach pad substantially covered with electrically conductive surfaces, the electrically conductive surfaces including at least one power surface and at least one ground surface, where the electrically conductive surfaces of the wire bond design package substrate make electrical connections with the electrically conductive vias of the wire bond design integrated circuit, wherein the die attach pad is no larger than the wire bond design integrated circuit,
electrically conductive bonding fingers disposed outside of the die attach pad on the front side of the package substrate,
electrical connections disposed on the back side of the package substrate, and
electrically conductive traces disposed between the front side of the package substrate and the back side of the package substrate, the electrically conductive traces electrically connecting the bonding fingers and the electrically conductive surfaces on the front side of the package substrate to the electrical connections on the back side of the package substrate, and
electrically conductive bonding wires forming electrical connections between the bonding pads and the bonding fingers.

7. The packaged integrated circuit of claim 6, wherein the electrically conductive vias each comprise a single vertical bore from the front side of the integrated circuit substrate to the back side of the integrated circuit substrate.

8. The packaged integrated circuit of claim 6, wherein at least one of the electrically conductive vias is disposed in a corner position of the of the integrated circuit substrate, such that when the integrated circuit substrate was singulated, only one-quarter of an original size of the at least one electrically conductive via remained in the integrated circuit substrate.

9. The packaged integrated circuit of claim 6, wherein the at least one power surface comprises four power surfaces, one of each of the four power surfaces disposed in one of each of four corner positions of the die attach pad.

10. The packaged integrated circuit of claim 6, wherein the at least one ground surface comprises only one ground surface disposed in at least a centered portion of the die attach pad.

* * * * *